United States Patent [19]

Ban et al.

[11] Patent Number: 5,147,742
[45] Date of Patent: Sep. 15, 1992

[54] PHOTOMASK AND FABRICATION OF THE SAME

[75] Inventors: Yasutaka Ban, Yokohama; Kazuo Tokitomo, Kawasaki, both of Japan

[73] Assignee: Fujitsu Limited, Kanagawa, Japan

[21] Appl. No.: 707,220

[22] Filed: May 24, 1991

Related U.S. Application Data

[63] Continuation of Ser. No. 450,955, Dec. 15, 1989, abandoned.

[30] Foreign Application Priority Data

Dec. 20, 1988 [JP] Japan .................. 63-325077

[51] Int. Cl.$^5$ .......................................... G03F 1/00
[52] U.S. Cl. .......................................... 430/5; 430/9; 430/13; 430/292
[58] Field of Search .................. 430/5, 9, 13, 292

[56] References Cited

U.S. PATENT DOCUMENTS

| | | | |
|---|---|---|---|
| 3,512,969 | 5/1970 | Robillard | 430/46 |
| 3,580,688 | 5/1971 | Schneider | 430/495 |
| 3,909,270 | 9/1975 | Kishi et al. | 430/495 |
| 4,670,366 | 6/1987 | Wu | 430/13 |
| 4,894,303 | 1/1990 | Wu | 430/13 |

FOREIGN PATENT DOCUMENTS

| | | | |
|---|---|---|---|
| 0212447 | 3/1983 | Japan | 430/5 |
| 2139781 | 11/1984 | United Kingdom | 430/5 |

OTHER PUBLICATIONS

Chemical Abstracts, vol. 87, No. 10, Sep. 5, 1977, Ref. No. 76338H, Gargarin et al.

Primary Examiner—Marion E. McCamish
Assistant Examiner—S. Rosasco
Attorney, Agent, or Firm—Nikaido, Marmelstein, Murray & Oram

[57] ABSTRACT

A photomask for an ultraviolet light with a contrast of 10 or larger can be fabricated by generating a color center by irradiating a calcium fluoride crystal substrate with a KrF excimer laser (wavelength of 248 nm) with an energy of 10 J/cm$^2$ through an original photomask formed by a chromium film on a quartz substrate and forming a pattern by a color center corresponding to an original photomask pattern. In the same way, a similar photomask can be fabricated by irradiating a calcium fluoride crystal substrate with X-rays having a wavelength ranging from 0.5 to 1.0 nm through an original mask formed by a gold film on the silicon substrate.

11 Claims, 5 Drawing Sheets

PHOTOMASK AND FABRICATION OF THE SAME

This application is a continuation of application Ser. No. 450,955 filed Dec. 15, 1989 now abandoned.

FIELD OF THE INVENTION

The present invention relates to a photomask for exposure and particularly to a photomask in which the mask pattern is formed by a color center.

BACKGROUND OF THE INVENTION

With improvements to higher densities in semiconductor integrated circuits, photolithography for a submicron region is now an indispensable technique. Light of a shorter wavelength is necessary as the light to be used for exposure. Generally the ultraviolet ray (UV) called the G-line or I-line generated from a high pressure mercury lamp has been used but an excimer laser is currently used instead of the ultraviolet ray. For example, the excimer lasers of dimer consisting of a rare gas and a halogen gas, such as xenon chloride (XeCl), krypton fluoride (KrF), and argon fluoride (ArF), emit laser beams having wavelengths of 306 nm, 248 nm and 198 nm, respectively. Of these laser beams, the wavelength of 306 nm of the XeC excimer laser beam is not very different from the wavelength 365 nm of the I-line of a high pressure mercury lamp. Therefore, it was not profitable to use such a laser beam for exposure of a fine pattern and only the light source called deep-UV, having a wavelength of 248 nm and 198 nm emitted by a KrF excimer laser or an ArF excimer laser, is now expected to provide excellent results for exposure to form a fine pattern.

A photomask for UV or deep-UV corresponding to a light source for exposure of UV or deep-UV, is necessary, upon execution of photolithography. The photomask of this type has usually been fabricated by the following method. A thin film which absorbs light, such as chromium (Cr) or chromium oxide ($CrO_x$), is formed on a mask substrate which transmits light. Next, the surface is then coated with a resist film and is patterned by electron beam lithography or UV light lithography. With this resist patterned used as the mask, a chromium film or chlomium oxide film is patterned and the desired photomask can thus be fabricated as described above.

Not only is the photomask fabrication method complicated but the accuracy of the photomask formed is governed by the accuracy of the resist pattern. Etching accuracy of the chlomium film or the chlomium oxide film and the photomask thus obtained is not suitable as the photomask for a submicron region.

In the UV and deep-UV wavelength band, absorption of light, as well as the environment gas, by an optical component and photomask substrate of the optical system for lithography such as a projection lens is generally distinctive. Moreover, a lattice defect called a color center is generated on these materials due to irradiation of UV and deep-UV. The lattice defect lowers the transmissivity of light through the materials. As a result, exposure intensity becomes small. Accordingly, selection of a material for a photomask substrate is particularly important.

Investigations for a generation mechanism and property of a color center have been made from various directions and these are described in detail, for example, in books by J. H. Schulman and W. D. Compton, "Color Centers in Solids", the MacMillian Co., (1962) and W. B. Fowler, "The Physics of Color Centers", (edited by W. B. Fowler) Academic Press (1968).

SUMMARY OF THE INVENTION

It is an object of the present invention to simplify the fabrication of a UV or a deep-UV photomask than that of the prior art.

It is another object of the present invention to improve the patterning accuracy of the UV or deep-UV photomask.

These objects may be achieved by a photomask of the present invention providing a substrate, made of material which transmits UV to deep-UV, and a mask pattern which is formed by the predetermined region of the substrate and consists of a color center which absorbs light ranging from visible light to deep-UV.

In the present invention, a color center generated in a halogenide of alkali metal such as a lithium fluoride (LiF) crystal or a halogenide of an alkaline-earth metal such as a calcium fluoride ($CaF_2$) crystal is used as the UV to deep-UV light absorbing material. Particularly, $CaF_2$ is a suitable material for the substrate because it shows a large transmissivity to UV to deep-UV light. The color center may be formed by selectively irradiating the predetermined region of the $CaF_2$ substrate with UV light or with X-rays. The color center usually absorbs light ranging from visible light to deep-UV light and therefore a photomask for the UV to deep-UV band may be fabricated by shaping the color center into the determined pattern.

A pattern, consisting of a color center, means a pattern of a light absorbing region at an atom level, for example, based on displacement of lattice atoms or lattice ions in the $CaF_2$ crystal forming the substrate or based on the excited state of electrons generated by emission or trapping of electrons. Therefore, in the pattern consisting of a color center, the recessed and projected areas do not exist at the surface of the substrate, unlike the pattern formed by the Cr thin film. As will be understood, the pattern consisting of a color center will be a mask pattern having an extremely high resolving power.

Moreover, in the method of fabrication of the present invention, the fabrication process is simplified when compared with the conventional photomask fabrication method comprising processes in which a light absorbing material, such as a Cr thin film, is formed on the substrate, a resist is formed thereon and is patterned and the light absorbing film is selectively etched.

Since the color center is annealable by heat treatment, revision (partial omission or addition) of the pattern after fabrication of the photomask and recovery of mask can be easily done. As a result, the usability of the photomask can be increased and cost reduction can also be realized.

DESCRIPTION OF THE PREFERRED EMBODIMENTS

Three embodiments of the present invention will be explained hereunder with reference to FIG. 1 to FIG. 5.

First Embodiment

Figure 1A:
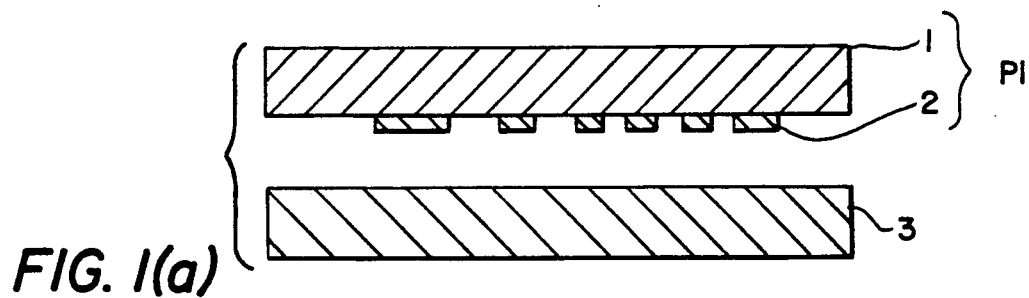
FIG. 1(a) is a schematic sectional view indicating a layout of an original photomask for deep-UV having an original pattern and a photomask substrate for fabricating a pattern corresponding to the original pattern.
Figure 1B:
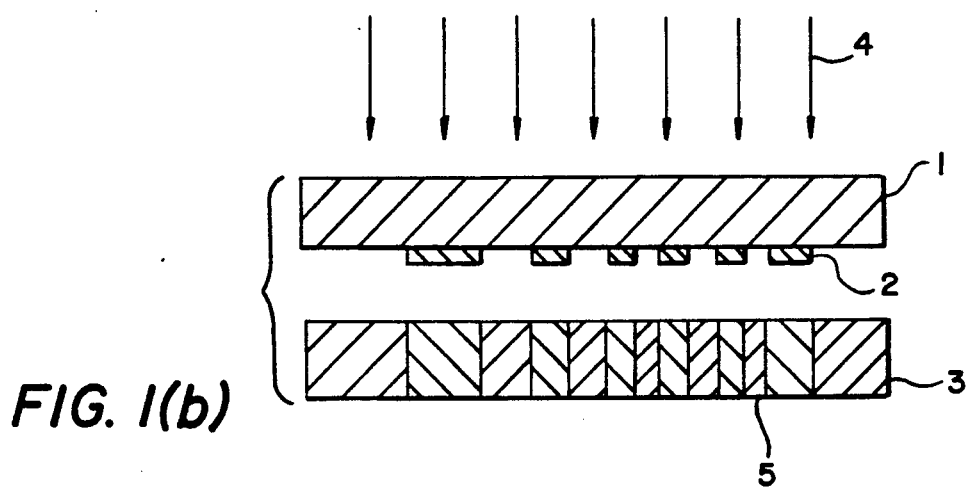
FIG. 1(b) is a schematic sectional view indicating a step for fabricating a pattern corresponding to the original pattern on the photomask substrate by irradiation of deep-UV from the rear substrate side of the original photomask.
Figure 1C:
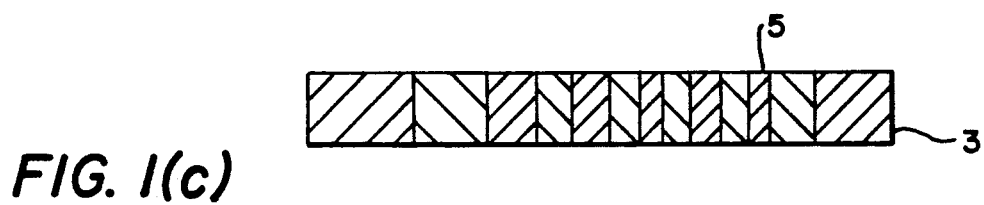
FIG. 1(c) is a schematic sectional view of a photomask fabricated by irradiation of deep-UV.

FIGS. 1(a) to 1(c) are schematic sectional diagrams of the essential part of a fabrication process of the photomask by the present invention. In FIG. 1(a), an original photomask P1 forming an original pattern 2 is fabricated by electron beam lithography or UV-lithography through formation of a light absorbing film such as a Cr film on a substrate 1, which is like a quartz ($SiO_2$) plate. A $CaF_2$ crystal substrate 3, showing high transmissivity for UV to deep-UV, is located in the position opposed to the original photomask P1. As shown in FIG. 1(b), the rear surface of the original photomask P1 is irradiated with a KrF excimer laser 4 having a wavelength of 248 nm. It is necessary that the laser beam 4 irradiating the substrate 3 through the photomask P1 has energy of 10 $J/cm^2$ or more. Since a color center is generated at a part of the substrate 3 irradiated by the laser beam 4, a mask pattern 5 consisting of an aggregation of a color center generated corresponding to the original pattern 2 shown in FIG. 1(c) is formed on the substrate 3. The original pattern 2 and mask pattern 5 are in a positive-negative relationship.

The contrast of the photomask fabricated as described above, that is a ratio of the intensity of light having passed through the photomask without shielding from the mask pattern and the intensity of the transmitted light shielded and attenuated by the mask pattern is 10 or larger.

In the first embodiment, a $CaF_2$ crystal has been used as the substrate 3, but it is also possible to use a quartz crystal for fabrication of the photomask for UV, or to use a halogenide of an alkali metal such as a lithium fluoride (LiF) crystal or a halogenide of an alkaline-earth metal such as a barium fluoride ($BaF_2$) crystal for fabrication of the photomask for deep-UV.

The transmissivity of light is gradually lowered because a color center is generated also on substrate 1 of the original photomask P1 when forming a mask pattern 5 on the substrate 3. However, since the substrate 1 of the original photomask P1 is uniformly irradiated with the deep-UV light, the time until the contrast of mask pattern 5 reaches the predetermined value becomes longer even when the color center is generated, but a mask pattern 5 is formed.

Figure 2:
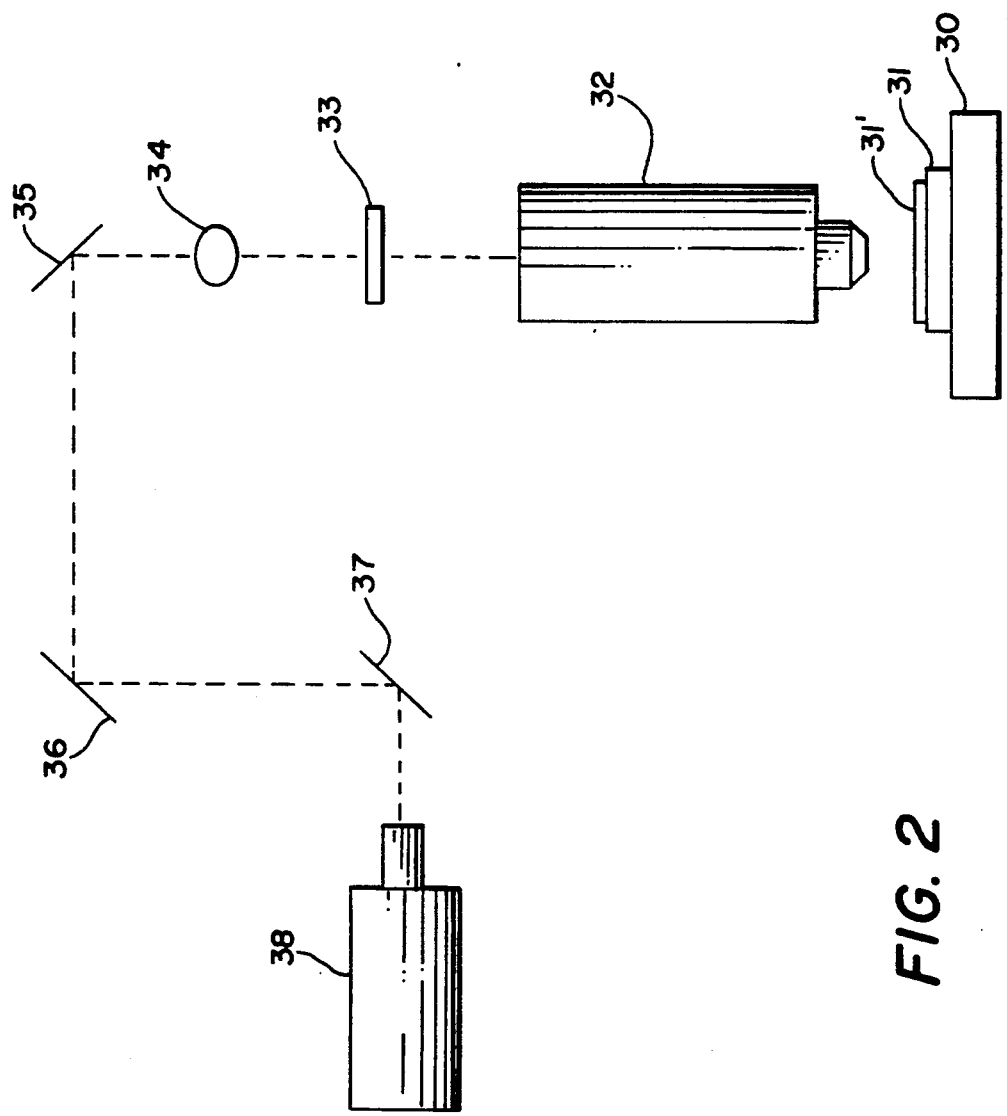
FIG. 2 is a schematic diagram indicating resist exposure of a wafer using a photomask fabricated by the method of the present invention.

FIG. 2 is a schematic diagram indicating actual exposure using the photomask shown in FIG. 1(c). A laser beam having a wavelength of 248 nm, emitted from the KrF excimer laser 38, is reflected by mirrors 37, 36, and 35 and irradiated the photomask 33 of the present invention through a lens 34. The light, having passed through the photo mask 33, passes through a projection lens system 32 for patterning of the resist and partially exposes a wafer 31 mounted on a stage 30. The photomask 33 and the wafer 31 are aligned by mechanically translating and rotating the stage 30 until the pattern provided on the photomask 33 and 31 are aligned. Thus, the pattern provided on the photomask 33 is transcribed onto the resist film 31' on the wafer 31. The KrF excimer laser 38 is used in this diagram, however, an ArF excimer laser can be used instead of the KrF excimer laser 38. In FIG. 2, the control system is omitted.

Figure 3A:
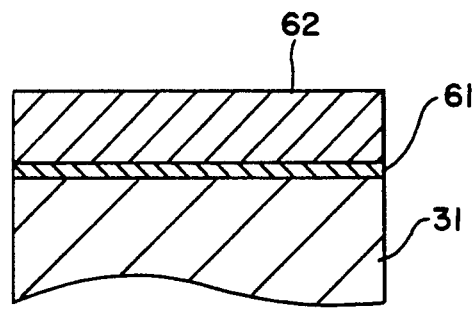
FIG. 3(a) is a schematic sectional view showing formation of a positive type resist OFPR-800 on the $SiO_2$ film formed on the surface of silicon wafer.
Figure 3B:
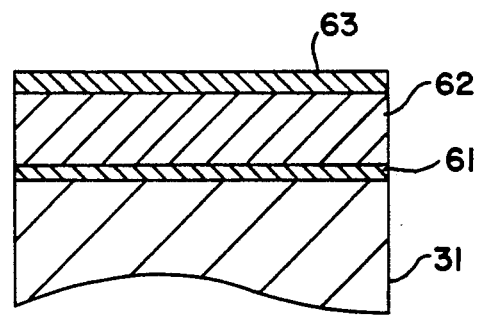
FIG. 3(b) is a schematic sectional view showing formation of a negative resist PVSS on the positive type resist OFPR-800.
Figure 3C:
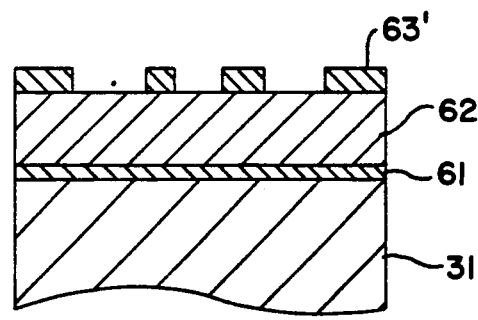
FIG. 3(c) is a schematic sectional view indicating a resist pattern formed by exposing the negative resist PVSS through the photomask obtained by the present invention and then developing the negative resist.
Figure 3D:
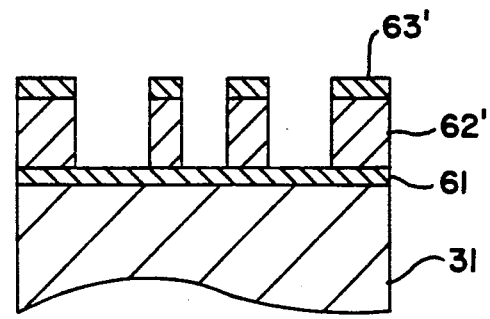
FIG. 3(d) is a schematic sectional view indicating a resist pattern formed by removing the positive type resist OFPR-800 using a reactive ion etching method by oxygen with the resist pattern shown in FIG. 3(c) used as the mask.

The resist patterning is carried out sequentially as shown in FIG. 3(a) to FIG. 3(d). FIGS. 3(a) to 3(b) show the sectional views of the essential part in each step of the process of resist patterning. As a resist, a double-layer resist is used wherein the first layer is a Novolak based positive type photoresist OFPR-800 (a product of TOKYO OHKA KOGYO LTD.) and the second layer is a negative type photoresist PVSS (polyvinyl silsesquioxane). As shown in FIG. 3(a), a positive type resist OFPR-800 is coated to a thickness of 1 to 1.5 microns as a first layer 62 on the silicon dioxide ($SiO_2$) film 61 formed at the surface of a silicon wafer 31. As shown in FIG. 3(b), a negative resist PVSS is coated to a thickness of 0.2 microns as the second layer 63. The silicon wafer 31 under this condition is mounted on the stage 30 shown in FIG. 2 and is exposed through the photomask 33. In this case, the irradiation energy by the KrF excimer laser 38 is 300 to 400 $mJ/cm^2$. After the exposure, when the second layer 63 is developed, the resist pattern 63', as shown in FIG. 3(c), can be obtained. Thereafter, when the first layer 62 is etched using reactive ion etching by oxygen with the resist pattern 63' used as the mask, the resist pattern 62', as shown in FIG. 3(d), can be obtained, completing the resist patterning.

Second Embodiment

In the first embodiment, deep-UV is used as the light source for exposure. In the second embodiment, deep-UV may be replaced with soft X-rays.

Figure 4A:
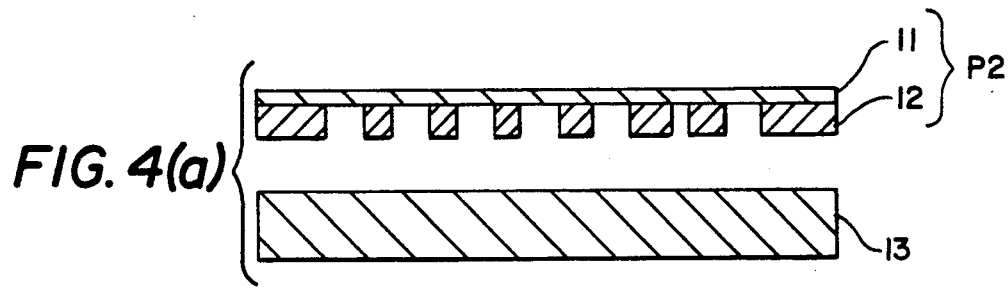
FIG. 4(a) is a schematic diagram of an original mask for X-rays having an original pattern and a layout of a photomask substrate for fabricating a pattern corresponding to the original pattern.
Figure 4B:
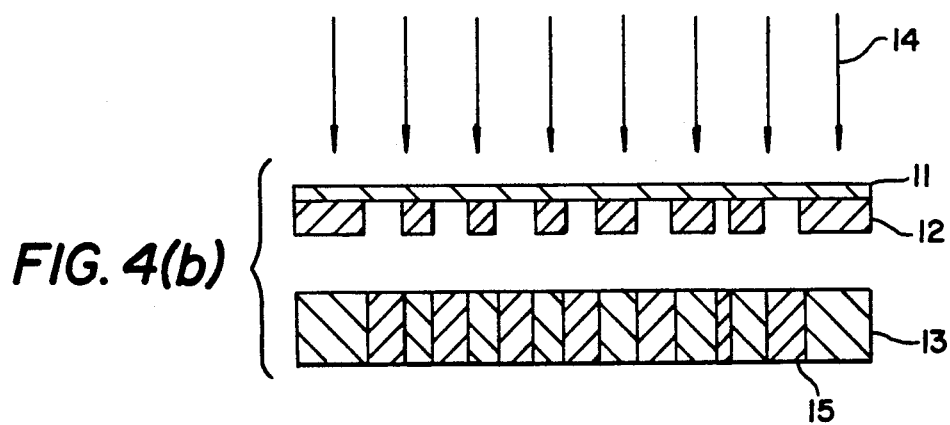
FIG. 4(b) is a schematic diagram indicating a step for fabricating a pattern corresponding to the original pattern on a photomask substrate by irradiation of X-rays from the rear surface side of the original mask.
Figure 4C:
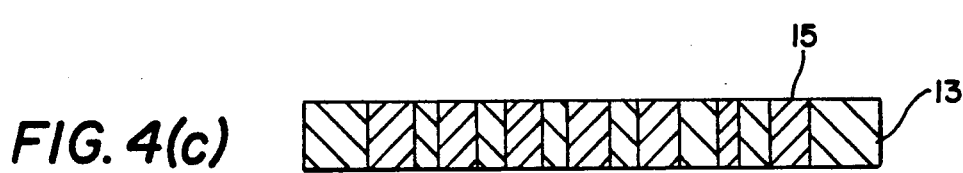
FIG. 4(c) is a schematic diagram of a photomask fabricated by irradiation of X-rays.

FIGS. 4(a) to 4(c) indicate schematic sectional views of the essential part for explaining the fabrication process of the photomask using soft X-rays. In FIG. 4(a), a substrate 11 of the original X-ray mask P2 is structured by a material which allows transmission of the X-rays such as silicon (Si), silicon dioxide ($SiO_2$), silicon nitride ($Si_3N_4$) or silicon carbide (SiC). The periphery of the substrate is fixed by a supporting frame. An original pattern 12 made of a material which absorbs the X-rays, such as gold (Au) and tantalum (Ta) is formed on the substrate. Like the first embodiment, the CaF$_2$ substrate 13 is located in a position opposed to the substrate 11 containing the original X-ray mask P2. The distance between the original pattern 12 and the CaF$_2$ substrate 13 is set to a range between 10 to 40 microns and thereby the original pattern 12 is not in contact with the CaF$_2$ substrate 13.

As shown in FIG. 4(b), the rear surface of substrate 11 of the original X-ray mask P2 is irradiated with soft X-rays. The substrate 13 is selectively irradiated with the soft X-rays through the original pattern 12. As a result, as shown in FIG. 4(c), a mask pattern 15 consisting of a color center generated corresponding to the original pattern 12 is formed on the substrate 13. In the second embodiment, the CaF$_2$ crystal has been used for the substrate 13, but it is possible to use quartz for fabrication of the photomask for UV and a halogenide of alkali metal such as a lithium fluoride (LiF) crystal or a halogenide of a alkaline-earth metal such as a calcium fluoride (CaF$_2$) crystal and a barium fluoride (BaF$_2$) crystal for fabrication of the photomask for deep-UV.

The film thickness of Au or Ta forming the original pattern 12 can be made so that a ratio T(sub)/T(m)T(sub), namely an inverse number of the transmissivity of the original pattern 12 becomes larger than 10 where the transmissivity of substrate 11 of the original X-ray mask for the soft X-rays is defined as T(sub) and the transmissivity of the original pattern 12 is defined as T(m).

A synchrotron radiation in the wavelength range of 0.5 to 1.0 nm may be used as the light source for soft X-rays 14.

Third Embodiment

An embodiment of revision and recovery of the photomask by the present invention will be explained hereunder.

Figure 5:
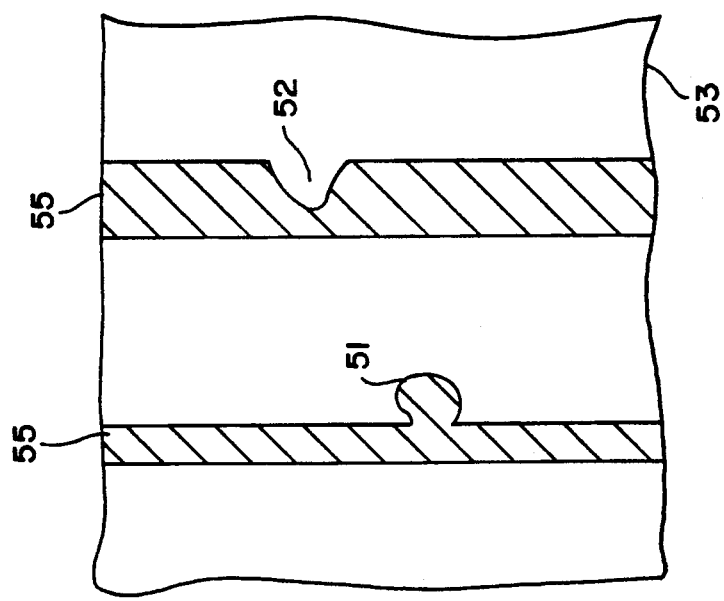
FIG. 5 is a partial plan view of a photomask pattern having defects to be corrected.

FIG. 5 is a partial plan view of a mask pattern in the photomask.

The mask pattern 55 is formed by a color center particularly including a projected defective part 51 and a recessed defective part 52. The size of the defective projected and recessed parts ranges from submicron to several tens of microns. The projected defective part 51 is irradiated with a focused CO$_2$ laser beam or a YAG laser beam and thereby the substrate 53 is heated up to 200° C. to 500° C. As a result, the color center forming the projected defective part 51 disappears and accordingly the projected defective part 51 also disappears.

When the recessed part 52 shown in FIG. 5 is selectively irradiated with the converted KrF excimer laser beam having a wavelength of 248 nm or is irradiated through a photomask provided with an aperture corresponding to the recessed part 52, the color center is generated at the recessed part 52 and thereby the predetermined mask pattern is added to the recessed part 52.

The mask pattern formed by the color center of the present invention is capable of not only correcting a pattern but also rewriting the desired pattern at the predetermined position of substrate 3 by a similar method used to form the pattern.

Moreover, the substrate 3 or substrate 13 may be used again through disappearance of all mask pattern 5 or mask pattern 15 formed on the substrate 3 or substrate 13 by eliminating the color center with a heat treatment for the entire part of substrate 3 or substrate 13 shown in FIGS. 1(c), 4(c) at a temperature of 300° C. to 500° C. under an inert gas environment.

It is apparent that the term "photomask" used in the embodiments of the present invention can also be applied to a reticle to be used for a reduced projection exposure method.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What we claim is:

1. A photomask to be used for photolithography utilizing light having a wavelength ranging from an ultraviolet wavelength region to a deep-ultraviolet wavelength region, said photomask comprising:
    a substrate made of a single layer of material which transmits light ranging from the ultraviolet wavelength region to the deep-ultraviolet wavelength region; and
    a mask pattern to be transcribed including a color center which absorbs light ranging from a visible wavelength region to the deep-ultraviolet wavelength region, said color center formed in a predetermined region of said substrate.

2. A photomask according to claim 1, wherein said substrate is selected from a group consisting of quartz, a halogenide of alkali metal and a halogenide of alkaline earth metal.

3. A method for fabricating a photomask to be used for photolithography, said method comprising the steps of:
    arranging an original photomask opposed to a substrate of a single layer of material, said substrate transmitting light ranging from ultraviolet light to deep ultraviolet light, said original photomask having an original pattern provided on an original substrate, said original substrate transmits light ranging from ultraviolet light to deep-ultraviolet light, said original pattern absorbing light ranging from visible light to deep-ultraviolet light; and
    forming a pattern including a color center corresponding to said original pattern on said substrate by irradiating said substrate with light, having a wavelength shorter than that of ultraviolet light, through said original photomask.

4. A method for fabricating a photomask according to claim 3, wherein said substrate forming said pattern formed by the color center is selected from a group consisting of quartz, a halogenide of alkali metal and a halogenide of alkaline earth metal.

5. A method for fabricating a photomask according to claim 3, wherein said pattern is formed by the color center generated through irradiation of a calcium fluoride crystal substrate with a krypton fluoride excimer laser having a wavelength of 248 nm with an energy larger than 10 J/cm$^2$.

6. A method for fabricating a photomask according to claim 3, wherein said pattern is formed by the color center generated through irradiation of a calcium fluoride crystal substrate with X-rays having a wavelength range of 0.5 to 1.0 nm.

7. A method for fabricating a photomask according to claim 3, wherein said method further comprises a step of eliminating the color center by selectively heating the color center formed, corresponding to the original pattern, on the region of said substrate which transmits light ranging from ultraviolet light to deep ultraviolet light.

8. A method for fabricating a photomask according to claim 3, wherein said method further comprises a step of eliminating a pattern formed by the color center by heating an entire part of said substrate forming said pattern.

9. A method for fabricating a photomask according to claim 7, wherein said color center is eliminating by heating a part forming said color center to a temperature of 200° C. to 500° C. through irradiation of the color center formed on calcium fluoride with a focused YAG (yttrium-aluminum-garnet) laser.

10. A method for transcribing a mask pattern, which is formed on a photomask, onto a photosensitive medium by exposing the photomask, said method comprising the steps of:

positioning the photomask opposed to said photosensitive medium to be irradiated, said photomask comprising a) a substrate, made of single layer of material which transmits light ranging from an ultraviolet wavelength region to a deep-ultraviolet wavelength region, and b) a mask pattern to be transcribed, said mask pattern including a color center which absorbs light ranging from a visible wavelength to a deep-ultraviolet wavelength, said color center formed in a predetermined region of said substrate; and transcribing said mask pattern onto said photosensitive medium by irradiating light ranging from ultraviolet light to deep-ultraviolet light on said photosensitive medium through said photomask.

11. A method for transcribing said mask pattern according to claim 10 wherein said irradiating light is one of a krypton fluoride excimer laser having a wavelength of 248 nm and an argon fluoride excimer laser having a wavelength of 198 nm.

* * * * *